(12) United States Patent
Gupta et al.

(10) Patent No.: US 10,943,670 B1
(45) Date of Patent: Mar. 9, 2021

(54) DUMMY WORDLINE DESIGN TECHNIQUES

(71) Applicant: Arm Limited, Cambridge (GB)

(72) Inventors: Lalit Gupta, Cupertino, CA (US); Shri Sagar Dwivedi, San Jose, CA (US); Fakhruddin Ali Bohra, San Jose, CA (US); Gaurav Rattan Singla, San Jose, CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/555,964

(22) Filed: Aug. 29, 2019

(51) Int. Cl.
| | | |
|---|---|---|
| G11C 7/14 | (2006.01) | |
| G11C 5/06 | (2006.01) | |
| G11C 8/14 | (2006.01) | |
| G11C 29/00 | (2006.01) | |
| G11C 11/4091 | (2006.01) | |
| G11C 8/18 | (2006.01) | |
| G11C 11/16 | (2006.01) | |

(52) U.S. Cl.
CPC ............... *G11C 29/76* (2013.01); *G11C 5/06* (2013.01); *G11C 7/14* (2013.01); *G11C 8/14* (2013.01); *G11C 8/18* (2013.01); *G11C 11/1657* (2013.01); *G11C 11/1673* (2013.01); *G11C 11/4091* (2013.01)

(58) Field of Classification Search
CPC ............... G11C 7/14; G11C 5/06; G11C 8/14
USPC ................................................. 365/210.1, 63
See application file for complete search history.

(56) References Cited

U.S. PATENT DOCUMENTS

| | | | | |
|---|---|---|---|---|
| 5,241,506 A | * | 8/1993 | Motegi | G11C 7/14 365/149 |
| 6,088,279 A | * | 7/2000 | Ishii | G11C 7/1051 365/210.1 |
| 6,483,754 B1 | * | 11/2002 | Agrawal | G11C 7/22 365/189.04 |
| 6,714,472 B2 | * | 3/2004 | Wilkins | G11C 7/06 365/194 |
| 6,977,834 B2 | * | 12/2005 | Onizawa | G11C 5/06 365/230.06 |
| 9,552,854 B1 | * | 1/2017 | Bonakdar | G11C 8/14 |
| 9,858,988 B1 | * | 1/2018 | Ghosh | G11C 11/419 |
| 9,953,701 B1 | * | 4/2018 | Bohra | G11C 11/419 |
| 10,283,191 B1 | * | 5/2019 | Pathak | G11C 11/418 |
| 10,658,028 B2 | * | 5/2020 | Ishii | G11C 7/12 |
| 2015/0085568 A1 | * | 3/2015 | Gulati | G11C 8/14 365/156 |
| 2019/0198074 A1 | * | 6/2019 | Ishii | G11C 7/12 |

* cited by examiner

*Primary Examiner* — Son L Mai (74) *Attorney, Agent, or Firm* — Pramudji Law Group PLLC; Ari Pramudji (57) ABSTRACT

Various implementations described herein are directed to a device having memory with an array of bitcells arranged in columns and rows, wherein a first number of columns represents a first number of output bits, and a second number of columns represents a second number of output bits. The device may include dummy wordline (DWL) circuitry having multiple DWL paths including a first DWL path disposed along the first number of columns and a second DWL path disposed along the second number of columns. The first DWL path has a shorter length than the second DWL path so as to allow for faster operation of the bitcells in the memory associated with the first number of output bits.

20 Claims, 7 Drawing Sheets

DUMMY WORDLINE DESIGN TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, memory devices typically have bitcells arranged in columns and rows that are coupled together with wordlines and bitlines which are used to access data stored in the bitcells. In some instances, loading on wordlines increases with respect to an increasing number of columns, wherein the read margin may be better at columns nearest control logic and worse at columns farthest from control logic. Thus, the read margin for accessing bitcells may be determined by the farthest bitcell, and tuning of the read margin for remaining bitcells may be difficult to modify. As such, there exists a need to improve physical design implementation of accessing bitcells so as to improve read margin and reduce complexity of implementing techniques for faster access.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to integrated circuit (IC) architecture that enables efficient bit blasting for optimized access time. Various schemes and techniques described herein may provide for optimized access time for bitcells that are disposed closer to control logic, and access time may vary for other bitcells.

Various implementations of dummy wordline (DWL) design techniques will be described in detail herein with reference to FIGS. 1-6.

Figure 1:
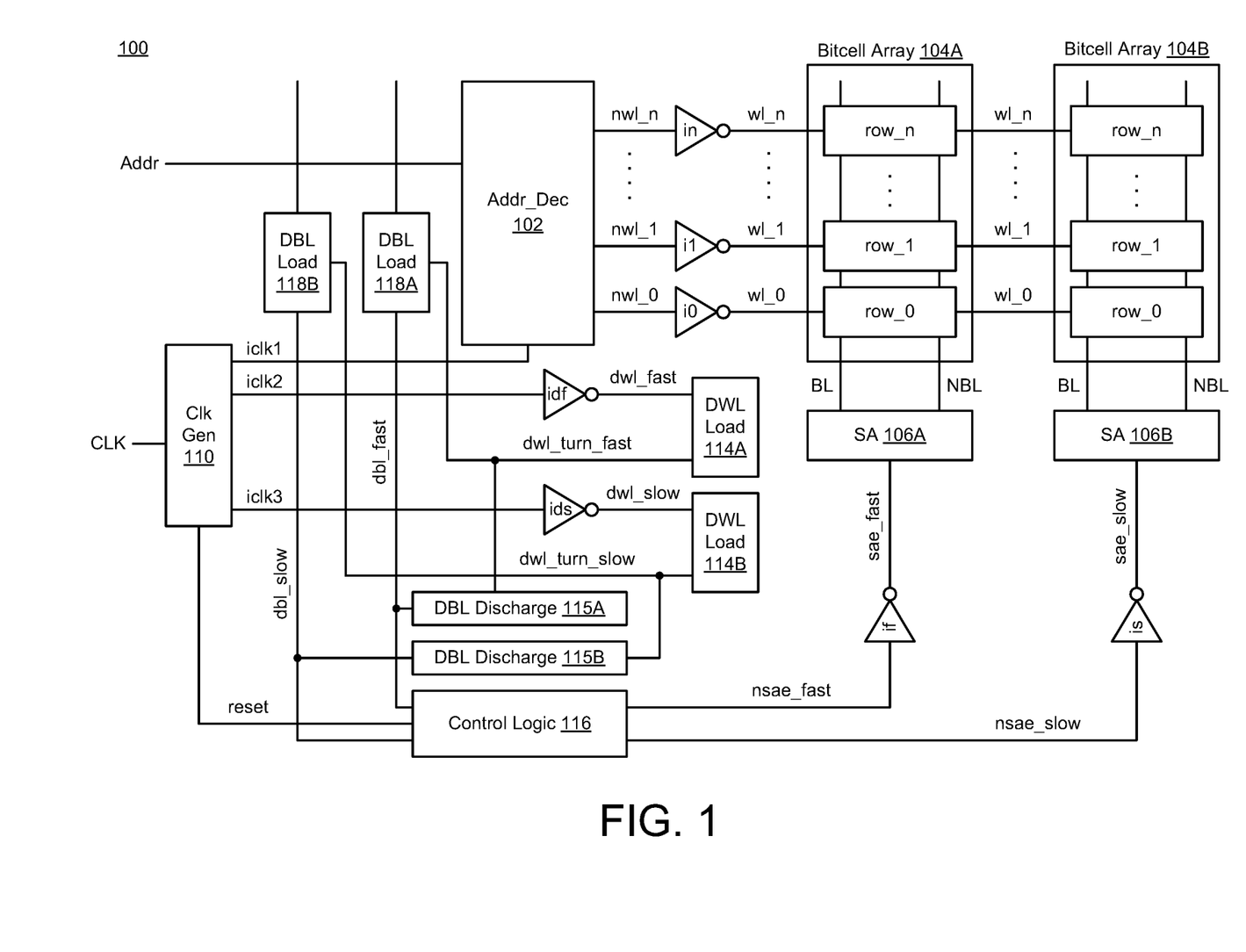
FIG. 1 illustrates a diagram of memory circuitry in accordance with various implementations described herein.

FIG. 1 illustrates a diagram of memory circuitry 100 having multiple dummy wordline (DWL) paths in accordance with various implementations described herein. The memory circuitry 100 may be implemented as a system or a device having various circuit components that are arranged and coupled together as an assemblage or combination of parts that provide for a physical circuit design and related structures. Also, a method of designing, providing and building the memory circuitry 100 may involve use of the various circuit components described herein so as to thereby implement the various DWL design schemes and techniques associated therewith.

As shown in FIG. 1, the memory circuitry 100 may include various circuitry including address decoder circuitry 102, multiple bitcell arrays 104A, 104B, multiple sense amplifiers 106A, 106B, clock generator circuitry 110, dummy bitline (DBL) circuitry, and dummy wordline (DWL) circuitry. The bitcell arrays 104A, 104B include multiple rows of bitcells row_0, row_1, row_2, . . . , row_n, and the sense amplifiers 106A, 106B may be coupled to each of the bitcells in each of the rows of bitcells row_0, row_1, row_2, . . . , row_n via complementary bitlines (BL, NBL). The memory circuitry 100 may also include a number of inverted wordlines (e.g., nwl_0, nwl_1, nwl_2, . . . , nwl_n) that are coupled between the address decoding circuitry 102 and the corresponding rows of bitcells row_0, row_1, row_2, . . . , row_n for access to each of the bitcells based on a selected wordline (e.g., wl_0, wl_1, wl_2, . . . , wl_n). Each of the inverted wordlines (nwl_0, nwl_1, nwl_2, . . . , nwl_n) have a corresponding wordline driver (e.g., inverters i0, i1, i2, . . . , in) coupled thereto to provide wordlines signals to the corresponding rows of bitcells row_0, row_1, row_2, . . . , row_n via to the wordlines (wl_0, wl_1, wl_2, . . . , wl_n).

The memory circuitry 100 may receive a clock signal CLK and an address signal Addr. The clock generation circuitry (Clkgen) 110 may receive the clock signal CLK and provide one or more internal clock signals, such as, e.g., a first internal clock signal i_clk1 to the address decoder 102 and a second internal clock signal i_clk2 to a dummy wordline driver (e.g., inverter id) via a dummy wordline (DWL). The address decoder 102 may receive multiple signals including, e.g., the address signal Addr and the first internal clock signal iclk1 and then access at least one inverted wordline (e.g., nwl_0, nwl_1, nwl_2, . . . , nwl_n) based on the received address signal Addr.

As further shown in FIG. 1, the dummy wordline (DWL) circuitry may include multiple DWL paths, including, e.g., a first path (dwl_fast) and a second path (dwl_slow), that are coupled between the clk_gen 110 and DBL loads 118A, 118B. For instance, the first DWL path (dwl_fast, dwl_turn_fast) may include a first DWL driver (idf), a first DWL load 114A, and a first DBL discharge cell 115A coupled to the first DBL load 118A via the first DBL (dbl_fast). Also, the second DWL path (dwl_slow, dwl_turn_slow) may include a second DWL driver (ids), a second DWL load 114B, and a second DBL discharge cell 115B coupled to the second DBL load 118B via the second DBL (dbl_slow).

In some implementations, the DWL circuitry includes at least first and second DWL paths (dwl_fast, dwl_slow). However, in other implementations, the DWL circuitry may include any number (N) of DWL paths based on, e.g., various circuit parameters and desired behaviors as may be implemented by a designer. For instance, the DWL circuitry may include a number (N) of DWL paths, such as, e.g., dwl_0, dwl_1, . . . , dwl_n, for any number (N) of columns and/or any number (N) of sets of columns. In addition, the DWL circuitry includes at least first and second DWL turn paths (dwl_turn_fast, dwl_turn_slow), and in various implementations, the DWL circuitry may include any number (N) of DWL turn paths, such as, e.g., dwl_turn_0, dwl_ turn_1, . . . , dwl_turn_n, for any number (N) of columns and/or any number (N) of sets of columns.

The memory circuitry 100 may include control logic circuitry 116 coupled to the DBL loads 118A, 118B via the DBLs (dbl_fast, dbl_slow). The control logic circuitry 116 may be coupled to the clk_gen 110 so as to receive a reset signal (reset) therefrom. The control logic circuitry 116 may be coupled to the sense amplifier circuitry 106A, 106B via inverters (if, is). Also, the control circuitry 116 may provide inverted sense amplifier enable signals (nsae_fast, nsae_slow) to the inverters (if, is), and the inverters (if, is) may provide complementary sense amplifier enable signal (sae_fast, sae_slow) to the sense amplifiers 106A, 106B. Further, as shown, internal clock signals (iclk2, iclk3) are input to the DWL drivers (idf, ids) via the DWL paths (dwl_fast, dwl_slow), which are coupled to the DWL loads 114A, 114B, respectively.

As shown in FIG. 1, this technique enables different DWL turn-around paths based on different bits in the same instance. The dwl_fast path may be implemented for a first number of bits, and the dwl_slow path may be implemented for a second number of bits, wherein the first number of bits is less than the second number of bits. Thus, with this technique, the bitcells associated with the first number of bits may be accessed faster than the second number of bits. For example, the dwl_fast path may turn-around after 20 bits, while the dwl_slow path may turn-around after 40 bits, and the dwl_fast path may trigger a faster sense-amp enable (sae) signal, while the dwl_slow path may trigger a slow sae signal. With this technique, better/faster timing for the first 0-40 bits may be achieved, while there may be slower timing for the second 41-80 bits.

In various implementations, each bitcell in the bitcell arrays 104A, 104B may be referred to as a memory cell, and also, each bitcell may be configured to store at least one data bit value (e.g., a data value associated with logical '0' or '1'). Each row of bitcells row_0, row_1, row_2, . . . , row_n in the bitcell arrays 104A, 104B may include any number of bitcells (or memory cells) that are arranged in various configurations, such as, e.g., a two-dimensional (2D) memory array having any number of columns (Ncolumns) and any any number of rows (Nrows) of multiple bitcells arranged in a 2D grid pattern with indexing capabilities. Each bitcell may be implemented with any type of memory, including, e.g., dual-port memory, single-port memory, static random access memory (SRAM), magneto-resistive RAM (MRAM), and/or any other type of memory. For instance, each bitcell may include a multi-transistor static RAM (SRAM) cell, including various types of SRAM cells, such as, e.g., 6T CMOS SRAM and/or any other type of complementary MOS (CMOS) SRAM cells, such as, e.g., 4T, 8T, 10T, or more transistors per bit. In other instances, each bitcell may include a multi-layer MRAM bitcell having free-layers and pinned layers, e.g., when tracking is needed on an associated CLK2Q path.

The memory circuitry 100 including each bitcell in the bitcell arrays 104A, 104B may be implemented as an integrated circuit (IC) with various types of memory circuitry, such as, e.g., dual-port, single-port, SRAM, MRAM, and/or any other type of memory, including any type of volatile and non-volatile memory. The memory circuitry 100 may be implemented as an IC with single and/or dual rail memory architectures, and the memory circuitry 100 may be integrated with computing circuitry and various related components on a single chip. Further, the memory circuitry 100 may be implemented in an embedded system for electronic, mobile, biometric and/or IoT (Internet-of-Things) applications.

Figure 2:
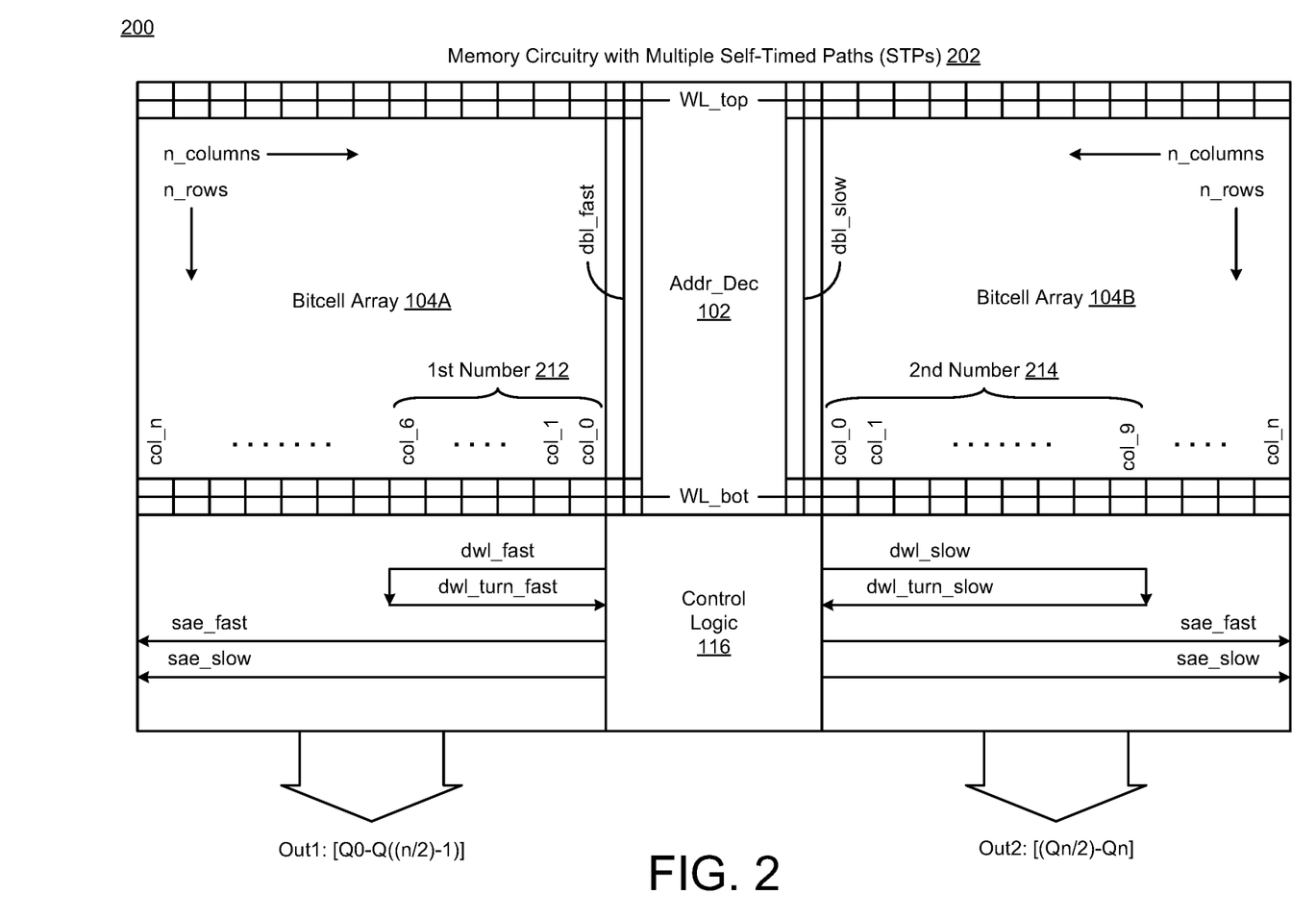
FIG. 2 illustrates a diagram of memory circuitry having multiple self-timed paths in accordance with various implementations described herein.

FIG. 2 illustrates a diagram of memory circuitry 200 having multiple self-timed paths 202 in accordance with implementations described herein. The memory circuitry 200 may be implemented as a system or a device having various circuit components that are arranged and coupled together as an assemblage or combination of parts that provide for a physical circuit design and related structures. Also, a method of designing, providing and building the memory circuitry 200 may involve use of the various circuit components described herein so as to implement DWL design techniques associated therewith.

FIG. 2 should be viewed in combination with the subject matter of FIG. 1, wherein similar components have similar scope, features and operation therein. Also, as described herein, the memory circuitry 200 refers to at least one of single-port memory, dual-port memory, SRAM and MRAM, and thus, the bitcells may be implemented with at least one of SRAM bitcells and MRAM bitcells in single or dual-port configurations.

As shown in FIG. 2, the memory circuitry 200 may include the bitcell arrays 104A, 104B that are arranged in a number of columns (n_columns) and a number of rows (n_rows). The first number of columns 212 may represent the first number of output bits (Out_1), and the second number of columns 214 may represent the second number of output bits (Out_2). The first number of output bits (Out_1) may refer to first output data (Out_1)=[Q0–Q((n/2)–1)], and the second number of output bits (Out_2) may refer to second output data (Out_2)=[(Qn/2)–Qn]. The bitcell arrays 104A, 104B may include arrays of bitcells that are arranged in the columns (n_columns) and the rows (n_rows), including a first bitcell array 104A and a second bitcell array 104B. The first bitcell array 104A may include the first number of columns 212 that represents the first number of output bits (Out_1), and the second bitcell array 104B may include the second number of columns 214 that represents the second number of output bits (Out_2).

The memory circuitry 200 may include dummy wordline (DWL) circuitry having multiple DWL paths including, e.g., a first DWL path (dwl_fast, dwl_turn_fast) disposed along the first number of columns 212 and a second DWL path (dwl_slow, dwl_turn_slow) disposed along the second number of columns 214. In some instances, the first DWL path (dwl_fast, dwl_turn_fast) has a shorter length than the second DWL path (dwl_slow, dwl_turn_slow) so as to allow for faster operation (e.g., faster access) of the bitcells in the memory circuitry 200 that are associated with the first number of output bits (Out_1). Also, the bitcells associated to the first number of output bits (Out_1) may be accessed faster than the bitcells associated with the second number of output bits (Out_2) due to the first DWL path (dwl_fast, dwl_turn_fast) having the shorter length than the second DWL path (dwl_slow, dwl_turn_slow).

In some implementations, the first DWL path (dwl_fast, dwl_turn_fast) may be disposed along the first number of columns 212 of the first bitcell array 104A, and the first DWL path (dwl_fast, dwl_turn_fast) includes a first DWL turn-around loop (dwl_turn_fast) having a shorter path length than the second DWL path (dwl_slow, dwl_turn_slow) so as to allow for faster operation of the bitcells in the memory circuitry that are associated with the first number of output bits (Out_1). The second DWL path (dwl_slow, dwl_turn_slow) may be disposed along the second number of columns 214 of the second array of bitcells 1046, and the second DWL path (dwl_slow, dwl_turn_slow) includes a second DWL turn-around loop (dwl_turn_slow) having a longer path length than the first DWL path (dwl_fast, dwl_turn_fast) so as to allow for slower operation of the bitcells in the memory circuitry that are associated with the second number of output bits (Out_2).

The memory circuitry 200 may include the control logic 116 coupled to the DWL circuitry (dwl_fast, dwl_turn_fast, dwl_slow, dwl_turn_slow). In some instances, as shown in FIG. 1, the sense amplifier circuitry 106A, 106B may be coupled to the bitcell arrays 104A, 104B via bitlines (BL, NBL), and the control logic 116 may be coupled between the sense amplifier circuitry 106A, 106B and the DWL circuitry via the DBL discharge circuitry 115A, 115B. Also, as shown in FIGS. 1-2, the control logic 116 may provide the enable signals (nsae_fast/sae_fast, nsae_slow/sae_slow) to the sense amplifier circuitry 106A, 106B that is associated with the DWL circuitry. The enable signals (nsae_fast/sae_fast, nsae_slow/sae_slow) include a first enable signal (nsae_fast/sae_fast), and the control logic 116 provides the first enable signal (nsae_fast/sae_fast) to the sense amplifier 106A in association with the first DWL path (dwl_fast) so as to provide for faster access of the first number of output bits 212, which are disposed closer to the control logic 116. The enable signals (nsae_fast/sae_fast, nsae_slow/sae_slow) include a second enable signal (nsae_slow/sae_slow) that is separate from the first enable signal (nsae_fast/sae_fast), and the control logic 116 provides the second enable signal (nsae_slow/sae_slow) to the sense amplifier 106B in association with the second DWL path (dwl_slow) so as to provide for slower access of the second number of output bits 214 that may be disposed further from the control logic 116 than the first number of output bits 212.

Figure 3A:
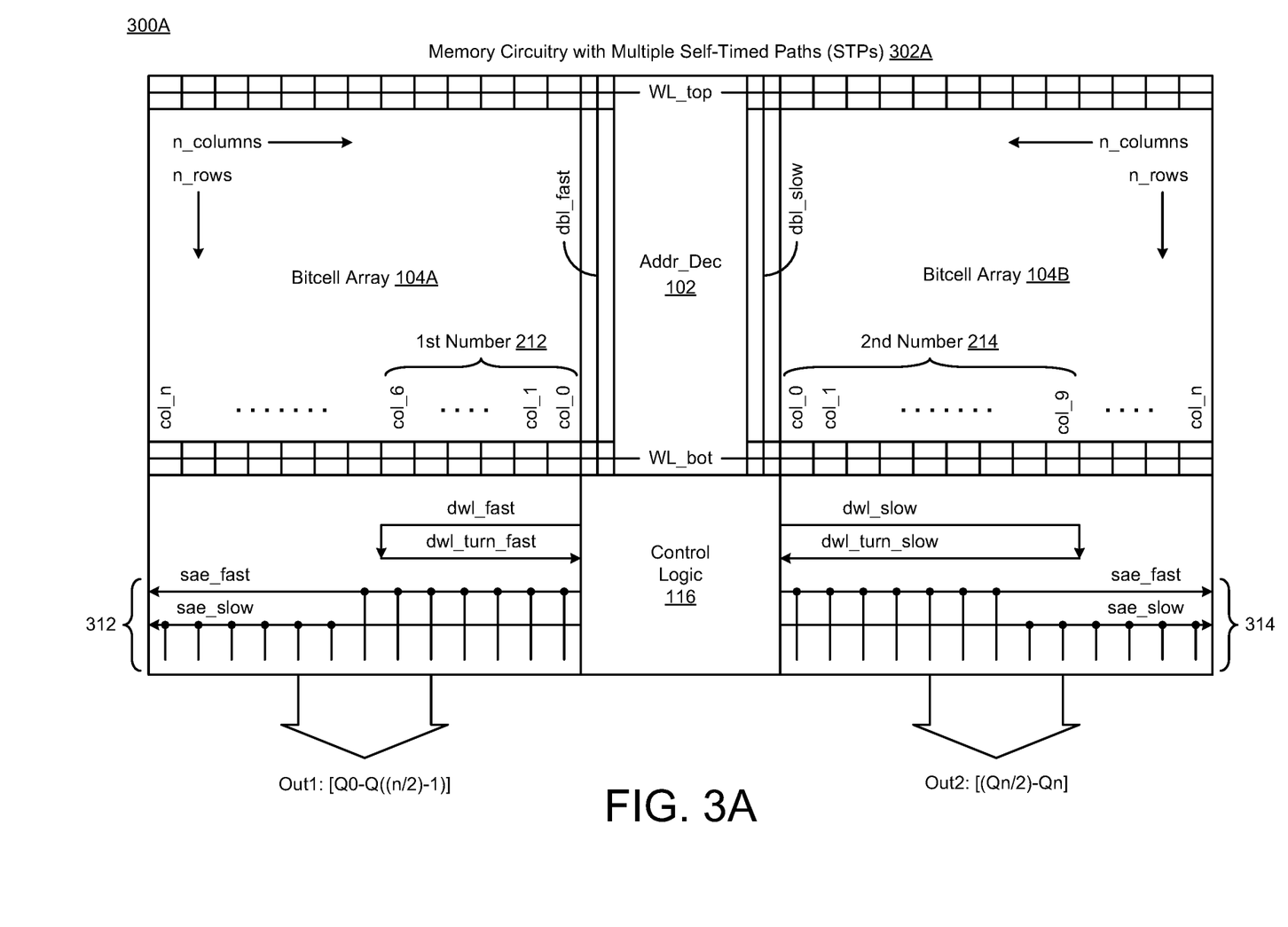
FIGS. 3A-3B illustrate various diagrams of memory circuitry having self-timed paths with output tapping in accordance with implementations described herein.
Figure 3B:
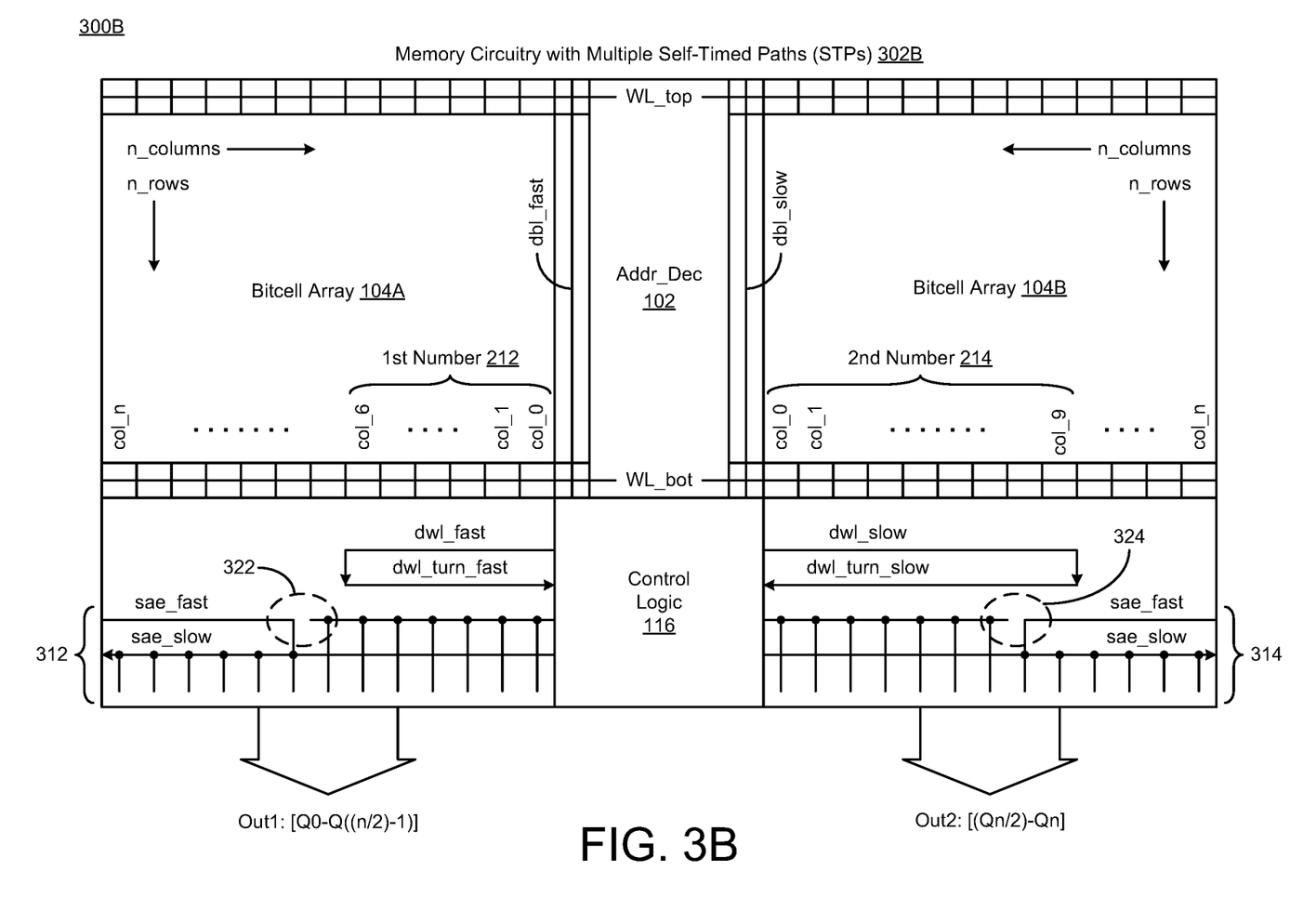

FIGS. 3A-3B illustrate diagrams of memory circuitry 300A, 300B having self-timed paths 302A, 302B with output tapping in accordance with various implementations described herein. In particular, FIG. 3A illustrates a diagram of memory circuitry 300A having self-timed path 302A with output tap lines 312, and FIG. 3B illustrates a diagram of memory circuitry 300B having self-timed path 302B with output tap lines 314. FIGS. 3A-3B should be viewed in combination with the subject matter of FIGS. 1-2, wherein similar components have similar scope, features and operation therein.

As shown in FIG. 3A, the DWL circuitry has multiple enable paths (sae_fast, sae_slow) that are coupled between the control logic 116 and the sense amplifier circuitry (e.g., 106A, 106B, as shown in FIG. 1). The multiple enable paths (sae_fast, sae_slow) include a first enable path (sae_fast) that is associated with the first DWL path (dwl_fast) for triggering input-output (IO) activity of the sense amplifier circuitry (106A, 106B), e.g., by tapping the first enable signal (sae_fast) with output tap lines 312, 314 so as to allow for faster operation of the bitcells in the memory circuitry that are associated with the first number of output bits (Out_1). Also, the multiple enable paths (sae_fast, sae_slow) may include a second enable path (sae_slow) that is associated with the second DWL path (dwl_slow) for triggering input-output (IO) activity of the sense amplifier circuitry (106A, 106B), e.g., by tapping the second enable signal (sae_slow) with output tap lines 312, 314 so as to allow for faster operation of the bitcells in the memory circuitry that are associated with the second number of output bits (Out_2).

As shown in FIG. 3B, the multiple enable paths (sae_fast, sae_slow) include the first enable paths (sae_fast) having at least one cut opening 322, 324 that allows for faster triggering of the IO activity of the sense amplifier circuitry (106A, 106B). In this instance, the output tap lines 312, 314 may be coupled to the first enable path (sae_fast) with the addition of the cut openings 322, 324 so as to allow for faster operation of the bitcells in the memory circuitry associated with the first number of output bits (Out_1).

Figure 4:
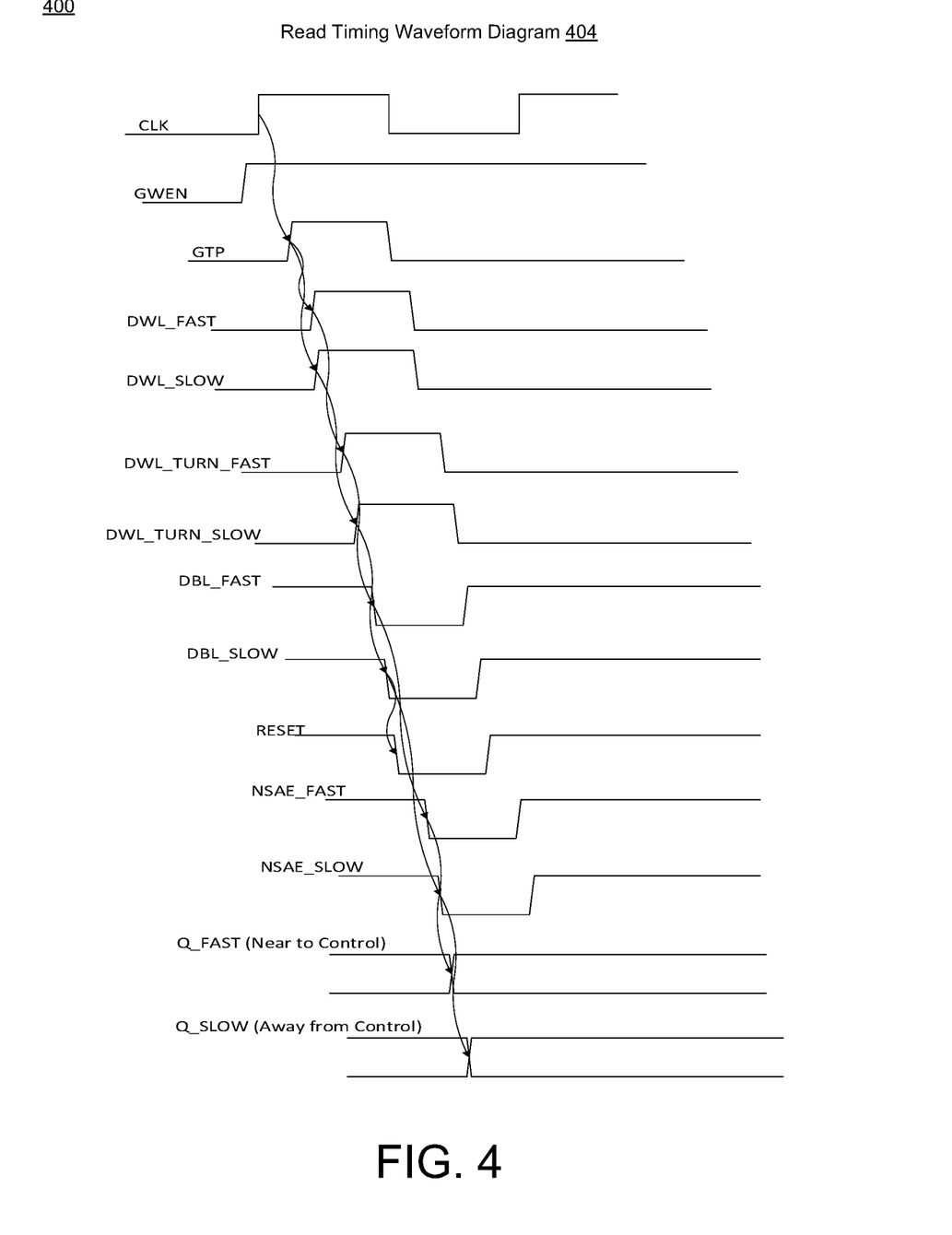
FIG. 4 illustrates a read timing waveform diagram in accordance with various implementations described herein.

FIG. 4 illustrates a read timing waveform diagram 400 in accordance with various implementations described herein. FIG. 4 should be viewed in combination with the subject matter of FIGS. 1-2 and FIGS. 3A-3B, wherein similar signals have similar scope, features and operation therein.

Figure 5:
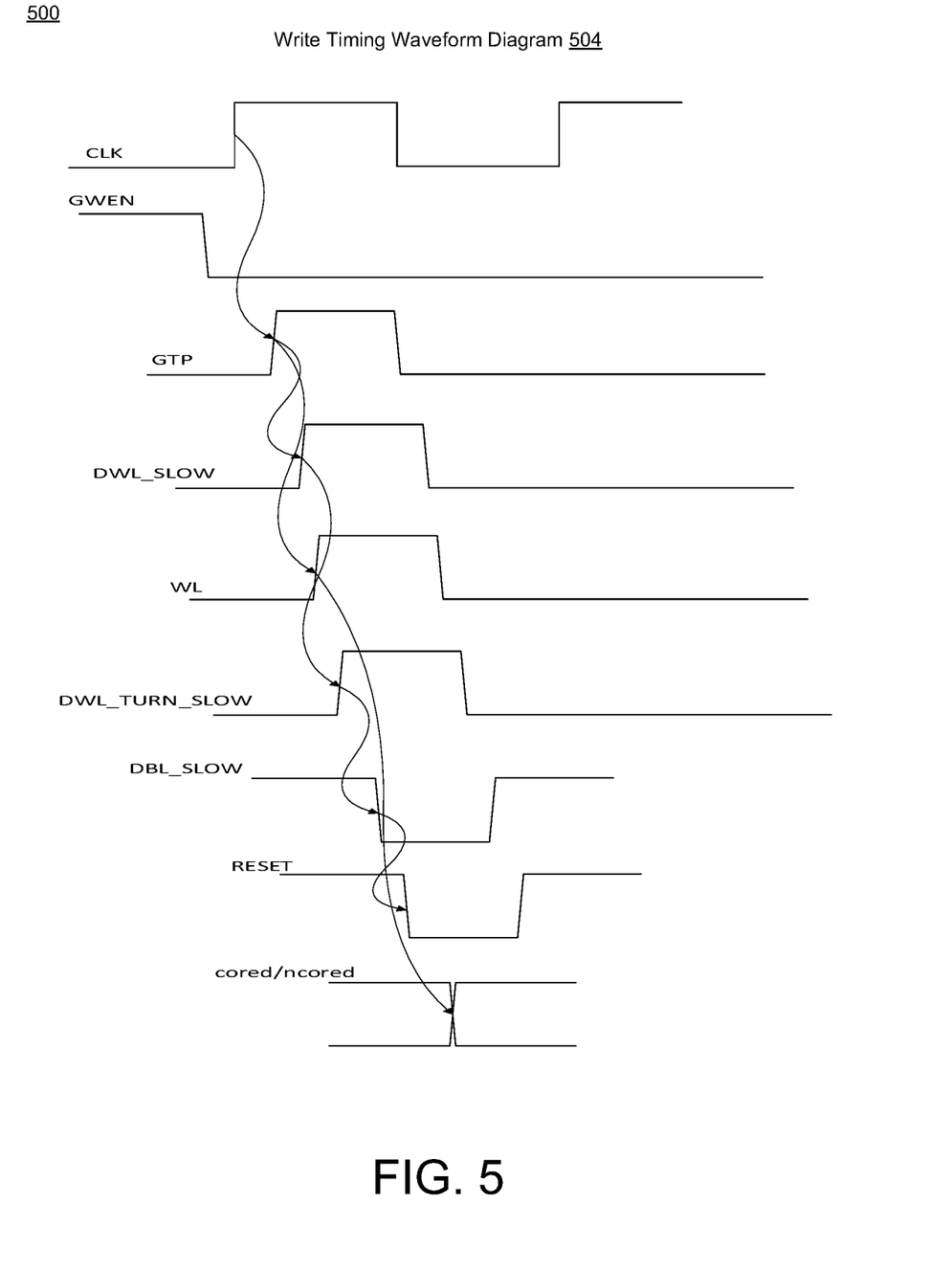
FIG. 5 illustrates a write timing waveform diagram in accordance with various implementations described herein.

In reference to signals depicted in FIGS. 4-5, CLK refers to an external input clock, and GTP refers to an internal self-timed clock that is referred to as a global timing pulse, wherein GTP goes high when CLK goes high, and GTP goes low through the self-timed path (STP). The dummy wordline (DWL) refers to the STP component that tracks loading on wordline (WL) in reference to the number of columns. The dummy wordline turn (dwl_turn) refers to the dwl after RC load tracking of the WL, and the dummy bitline (DBL) is used to track bitline loading (in reference to the number of rows), wherein the DBL may be discharged by the dwl_turn going high.

As shown in FIG. 4, during activation of a global write enable signal (GWEN), the rising edge of a clock pulse signal (CLK) triggers the rising edge of a global timing pulse signal (GTP). The rising edge of the GTP signal triggers the rising edge of the dwl_fast signal and trigger the rising edge of the dwl_slow signal. The rising edge of the dwl_fast signal triggers the rising edge of the dwl_turn_fast signal, and the rising edge of the dwl_slow signal triggers the rising edge of the dwl_turn_slow signal. The rising edge of the dwl_turn_slow signal triggers the rising edge of the dbl_fast signal, and the rising edge of the dwl_turn_slow signal triggers the rising edge of the dbl_slow signal. The dbl_slow signal triggers a reset signal. The dbl_fast signal triggers the nsae_fast signal, and the dbl_slow signal triggers the nsae_slow signal. The nsae_fast signal triggers the Q_fast signal that is near to control logic 116, and the nsae_slow signal triggers the Q_slow signal that is further away from control logic 116.

FIG. 5 illustrates a write timing waveform diagram 500 in accordance with various implementations described herein. FIG. 5 should be viewed in combination with the subject matter of FIGS. 1-2 and FIGS. 3A-3B, wherein similar signals have similar scope, features and operation therein.

As shown in FIG. 5, during activation of the GWEN signal, the rising edge of the CLK signal triggers the rising edge of GTP signal. The rising edge of the GTP signal triggers the rising edge of the dwl_slow signal, and also, the rising edge of the GTP signal triggers the rising edge of the wordline (WL) signal. The rising edge of the dbl_slow signal triggers the rising edge of the dwl_turn_slow signal, and the rising edge of the WL signal triggers the rising/falling edge of the cored/ncored signals. Also, the rising edge of the dwl_turn_slow signal triggers the rising edge of the dbl_slow signal, and the rising edge of the dbl_slow signal triggers the rising edge of the reset signal.

Figure 6:
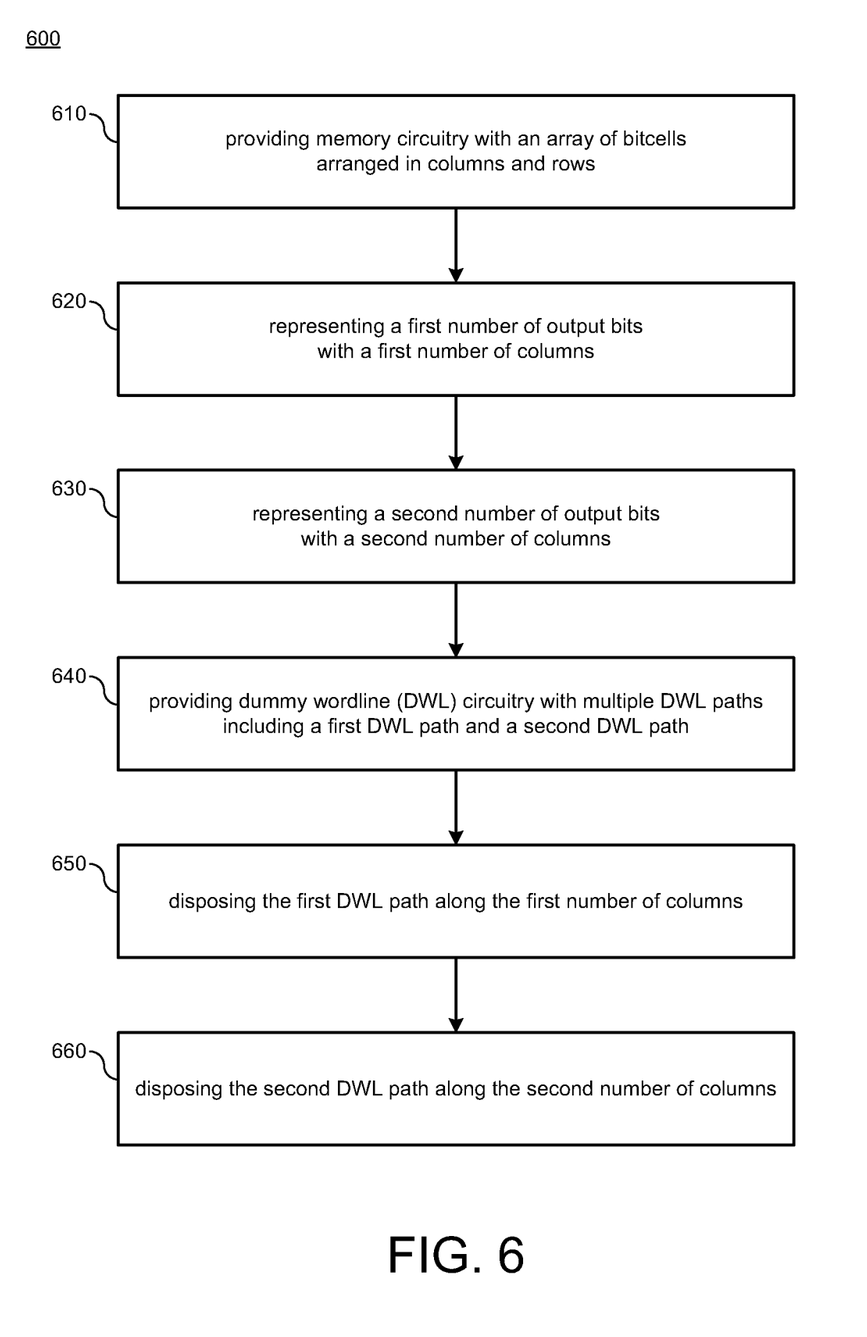
FIG. 6 illustrates a process flow diagram of a method for providing memory circuitry in accordance with implementations described herein.

FIG. 6 illustrates a process diagram of a method 600 for providing memory circuitry in accordance with various implementations described herein.

It should be understood that even though method 600 may indicate a particular order of operation execution, in some cases, various certain portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various circuit elements, such as described herein above in reference to FIGS. 1-5. If implemented in software, the method 600 may be implemented as a program and/or software instruction process that may be configured for providing DWL design techniques as described herein. Also, if implemented in software, instructions related to implementing the method 600 may be stored in memory and/or a database. For instance, a computer or various other types of computing devices having a processor and memory may be configured to perform method 600.

As described and shown in reference to FIG. 6, method 600 may be utilized for fabricating and/or manufacturing, or causing to be fabricated and/or manufactured, an integrated circuit (IC) that implements DWL design schemes and techniques as described herein that are related to providing DWL architecture and/or various associated systems, devices, components, circuits and related architecture.

At block 610, method 600 may provide memory circuitry with an array of bitcells arranged in columns and rows. At block 620, method 600 may represent a first number of output bits with a first number of columns. At block 630, method 600 may represent a second number of output bits with a second number of columns. At block 640, method 600 may provide dummy wordline (DWL) circuitry with multiple DWL paths including a first DWL path and a second DWL path. At block 650, method 600 may dispose the first DWL path along the first number of columns, and at block 660, method 600 may dispose the second DWL path along the second number of columns. The first DWL path has a shorter length than the second DWL path so as to allow for faster operation of the bitcells in the memory circuitry that are associated with the first number of output bits.

In some implementations, the bitcells associated to the first number of output bits are accessed faster than the bitcells associated with the second number of output bits due to the first DWL path having the shorter length than the second DWL path. Also, in some instances, method 600 may include coupling sense amplifier circuitry to the array of bitcells via bitlines, coupling control logic between the sense amplifier circuitry and the DWL circuitry, and using the control logic to provide enable signals to the sense amplifier circuitry associated with the DWL circuitry. In this instance, the enable signals include a first enable signal, and method 600 may include using the control logic to provide the first enable signal to the sense amplifier circuitry in association with the first DWL path so as to provide for faster access of the first number of output bits that are disposed closer to the control logic. Also, in this instance, the enable signals include a second enable signal separately from the first enable signal, and also, method 600 may include using the control logic to provide the second enable signal to the sense amplifier circuitry in association with the second DWL path so as to provide for slower access of the second number of output bits that are disposed further from the control logic.

Described herein are various implementations of a device. The device may include memory circuitry having an array of bitcells arranged in columns and rows, and a first number of columns represents a first number of output bits, and a second number of columns represents a second number of output bits. The device may include dummy wordline (DWL) circuitry having multiple DWL paths including a first DWL path disposed along the first number of columns and a second DWL path disposed along the second number of columns. The first DWL path has a shorter length than the second DWL path so as to allow for faster operation of the bitcells in the memory circuitry that are associated with the first number of output bits.

Described herein are various implementations of a system. The system may include memory circuitry having multiple bitcell arrays including a first bitcell array and a second bitcell array. The system may include dummy wordline (DWL) circuitry coupled to the multiple bitcell arrays including first DWL circuitry and second DWL circuitry. The first DWL circuitry is associated with a first number of columns in the first bitcell array, the second DWL circuitry is associated with a second number of columns in the second bitcell array, and the first number of columns is less than the second number of columns.

Described herein are various implementations of a method. The method may include providing memory circuitry with an array of bitcells arranged in columns and rows, representing a first number of output bits with a first number of columns, and representing a second number of output bits with a second number of columns. The method may include providing dummy wordline (DWL) circuitry with multiple DWL paths including a first DWL path and a second DWL path, disposing the first DWL path along the first number of columns, and disposing the second DWL path along the second number of columns. The first DWL path has a shorter length than the second DWL path.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business-related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
memory circuitry having an array of bitcells arranged in columns and rows, wherein a first number of columns represents a first number of output bits, and wherein a second number of columns represents a second number of output bits; and
dummy wordline (DWL) circuitry having multiple DWL paths including a first DWL path disposed along the first number of columns and a second DWL path disposed along the second number of columns,
wherein the first DWL path has a shorter length than the second DWL path so as to allow for faster operation of the bitcells in the memory circuitry that are associated with the first number of output bits, and wherein the first DWL path comprises a first DWL turn-around loop and the second DWL path comprises a second DWL turn-around loop.

2. The device of claim 1, wherein the bitcells associated to the first number of output bits are accessed faster than the bitcells associated with the second number of output bits due to the first DWL path having the shorter length than the second DWL path.

3. The device of claim 1, further comprises:
sense amplifier circuitry coupled to the array of bitcells via bitlines; and
control logic coupled between the sense amplifier circuitry and the DWL circuitry,
wherein the control logic provides enable signals to the sense amplifier circuitry associated with the DWL circuitry.

4. A device, comprising:
memory circuitry having an array of bitcells arranged in columns and rows, wherein a first number of columns represents a first number of output bits, and wherein a second number of columns represents a second number of output bits;
dummy wordline (DWL) circuitry having multiple DWL paths including a first DWL path disposed along the first number of columns and a second DWL path disposed along the second number of columns, wherein the first DWL path has a shorter length than the second DWL path so as to allow for faster operation of the bitcells in the memory circuitry that are associated with the first number of output bits;
sense amplifier circuitry coupled to the array of bitcells via bitlines; and
control logic coupled between the sense amplifier circuitry and the DWL circuitry, wherein the control logic provides enable signals to the sense amplifier circuitry associated with the DWL circuitry, and wherein:
the enable signals include a first enable signal, and
the control logic provides the first enable signal to the sense amplifier circuitry in association with the first DWL path so as to provide for faster access of the first number of output bits that are disposed closer to the control logic.

5. The device of claim 4, wherein:
the enable signals include a second enable signal separately from the first enable signal, and
the control logic provides the second enable signal to the sense amplifier circuitry in association with the second DWL path so as to provide for slower access of the second number of output bits that are disposed further from the control logic.

6. The device of claim 5, wherein:
the DWL circuitry has multiple enable paths coupled between the control logic and the sense amplifier circuitry,
the multiple enable paths include a first enable path associated with the first DWL path for triggering input-output (IO) activity of the sense amplifier circuitry by tapping the first enable signal to allow for faster operation of the bitcells in the memory circuitry that are associated with the first number of output bits, and
the multiple enable paths include a second enable path associated with the second DWL path for triggering input-output (IO) activity of the sense amplifier circuitry by tapping the second enable signal to allow for faster operation of the bitcells in the memory circuitry that are associated with the second number of output bits.

7. The device of claim 1, wherein:
the array of bitcells comprises multiple arrays of bitcells arranged in columns and rows, including a first array of bitcells and a second array of bitcells,
the first array of bitcells includes the first number of columns that represents the first number of output bits, and
the second array of bitcells includes the second number of columns that represents the second number of output bits.

8. A device, comprising:
memory circuitry having an array of bitcells arranged in columns and rows, wherein a first number of columns represents a first number of output bits, and wherein a second number of columns represents a second number of output bits; and dummy wordline (DWL) circuitry having multiple DWL paths including a first DWL path disposed along the first number of columns and a second DWL path disposed along the second number of columns, wherein the first DWL path has a shorter length than the second DWL path so as to allow for faster operation of the bitcells in the memory circuitry that are associated with the first number of output bits, and wherein:
- the array of bitcells comprises multiple arrays of bitcells arranged in columns and rows, including a first array of bitcells and a second array of bitcells,
- the first array of bitcells includes the first number of columns that represents the first number of output bits,
- the second array of bitcells includes the second number of columns that represents the second number of output bits,
- the first DWL path is disposed along the first number of columns of the first array of bitcells, and
- the first DWL path refers to a first DWL turn-around loop having a shorter path length than the second DWL path so as to allow for faster operation of the bitcells in the memory circuitry that are associated with the first number of output bits.

9. The device of claim 8, wherein:
the second DWL path is disposed along the second number of columns of the second array of bitcells, and
the second DWL path refers to a second DWL turn-around loop having a longer path length than the first DWL path so as to allow for slower operation of the bitcells in the memory circuitry that are associated with the second number of output bits.

10. The device of claim 1, wherein the memory circuitry refers to at least one of single-port memory, dual-port memory, static random access memory (SRAM) and magneto-resistive RAM (MRAM), and wherein the bitcells refer to at least one of SRAM bitcells and MRAM bitcells.

11. A system, comprising:
memory circuitry having multiple bitcell arrays including a first bitcell array and a second bitcell array; and
dummy wordline (DWL) circuitry coupled to the multiple bitcell arrays including first DWL circuitry and second DWL circuitry,
wherein the first DWL circuitry is associated with a first number of columns in the first bitcell array, the second DWL circuitry is associated with a second number of columns in the second bitcell array, and the first number of columns is less than the second number of columns, and wherein the first DWL circuitry comprises a first DWL path having a first DWL turn-around loop and the second DWL circuitry comprises a second DWL path having a second DWL turn-around loop.

12. The system of claim 11, wherein bitcells in the first bitcell array are accessed faster than bitcells in the second bitcell array due to the first number of columns being less than the second number of columns.

13. The system of claim 12, wherein:
the first DWL path is disposed along the first number of columns, and
the second DWL path is disposed along the second number of columns, and
the first DWL path has a shorter length than the second DWL path so as to allow for faster operation of the bitcells in the memory circuitry that are associated with the first bitcell array.

14. The system of claim 13, wherein the bitcells in the first bitcell array are accessed faster than the bitcells in the second bitcell array due to the first number of columns being less than the second number of columns.

15. The system of claim 11, further comprises:
first sense amplifier circuitry coupled to the first bitcell array via first bitlines;
second sense amplifier circuitry coupled to the second bitcell array via second bitlines; and
control logic coupled to the first DWL circuitry, the second DWL circuitry, the first sense amplifier circuitry and the second sense amplifier circuitry,
wherein the control logic provides enable signals to the first sense amplifier circuitry and the second sense amplifier circuitry.

16. A system, comprising:
memory circuitry having multiple bitcell arrays including a first bitcell array and a second bitcell array;
dummy wordline (DWL) circuitry coupled to the multiple bitcell arrays including first DWL circuitry and second DWL circuitry, wherein the first DWL circuitry is associated with a first number of columns in the first bitcell array, the second DWL circuitry is associated with a second number of columns in the second bitcell array, and the first number of columns is less than the second number of columns;
first sense amplifier circuitry coupled to the first bitcell array via first bitlines;
second sense amplifier circuitry coupled to the second bitcell array via second bitlines; and
control logic coupled to the first DWL circuitry, the second DWL circuitry, the first sense amplifier circuitry and the second sense amplifier circuitry, wherein the control logic provides enable signals to the first sense amplifier circuitry and the second sense amplifier circuitry, and wherein:
- the enable signals include a first enable signal and a second enable signal that is separate from the first enable signal,
- the control logic provides the first enable signal to the first sense amplifier circuitry in association with the first DWL circuitry so as to provide for faster access of the first number of columns that are disposed closer to the control logic, and
- the control logic provides the second enable signal to the second sense amplifier circuitry in association with the second DWL circuitry so as to provide for slower access of the second number of columns that are disposed further from the control logic.

17. A method, comprising:
providing memory circuitry with an array of bitcells arranged in columns and rows;
representing a first number of output bits with a first number of columns;
representing a second number of output bits with a second number of columns;
providing dummy wordline (DWL) circuitry with multiple DWL paths including a first DWL path and a second DWL path;
disposing the first DWL path along the first number of columns; and
disposing the second DWL path along the second number of columns,
wherein the first DWL path has a shorter length than the second DWL path, and wherein the first DWL path comprises a first DWL turn-around loop and the second DWL path comprises a second DWL turn-around loop.

18. The method of claim 17, wherein the bitcells associated to the first number of output bits are accessed faster than the bitcells associated with the second number of output bits due to the first DWL path having the shorter length than the second DWL path.

19. The method of claim 17, further comprises:
coupling sense amplifier circuitry to the array of bitcells via bitlines; and
coupling control logic between the sense amplifier circuitry and the DWL circuitry,
using the control logic to provide enable signals to the sense amplifier circuitry associated with the DWL circuitry.

20. A method, comprising:
providing memory circuitry with an array of bitcells arranged in columns and rows;
representing a first number of output bits with a first number of columns;
representing a second number of output bits with a second number of columns;
providing dummy wordline (DWL) circuitry with multiple DWL paths including a first DWL path and a second DWL path;
disposing the first DWL path along the first number of columns;
disposing the second DWL path along the second number of columns, wherein the first DWL path has a shorter length than the second DWL path;
coupling sense amplifier circuitry to the array of bitcells via bitlines; and
coupling control logic between the sense amplifier circuitry and the DWL circuitry, using the control logic to provide enable signals to the sense amplifier circuitry associated with the DWL circuitry, wherein:
the enable signals include a first enable signal and a second enable signal that is separate from the first enable signal,
using the control logic to provide the first enable signal to the sense amplifier circuitry in association with the first DWL path so as to provide for faster access of the first number of output bits that are disposed closer to the control logic, and
using the control logic to provide the second enable signal to the sense amplifier circuitry in association with the second DWL path so as to provide for slower access of the second number of output bits that are disposed further from the control logic.

* * * * *